(12) United States Patent
Heide et al.

(10) Patent No.: US 6,317,075 B1
(45) Date of Patent: Nov. 13, 2001

(54) FMCW SENSOR

(75) Inventors: Patric Heide, Neubiberg; Martin Nalezinski, München, both of (DE)

(73) Assignee: Siemens Aktiengesselschaft, Munich (DE)

(*) Notice: Subject to any disclaimer, the term of this patent is extended or adjusted under 35 U.S.C. 154(b) by 0 days.

(21) Appl. No.: 09/486,351

(22) PCT Filed: Jul. 31, 1998

(86) PCT No.: PCT/DE98/02198
§ 371 Date: Feb. 25, 2000
§ 102(e) Date: Feb. 25, 2000

(87) PCT Pub. No.: WO99/10756
PCT Pub. Date: Mar. 4, 1999

(30) Foreign Application Priority Data

Aug. 27, 1997 (DE) .............................................. 197 37 385

(51) Int. Cl.$^7$ ................ G01S 13/34; G01S 7/35
(52) U.S. Cl. ............................. 342/128; 342/200
(58) Field of Search ................... 342/109, 128, 342/189, 200

(56) References Cited

U.S. PATENT DOCUMENTS

| 5,280,290 | * | 1/1994 | Evans | .................. 342/128 |
| 5,546,088 |   | 8/1996 | Trummer et al. |

FOREIGN PATENT DOCUMENTS

| 196 10 850 | 4/1997 | (DE) . |
| 196 42 900 | 4/1997 | (DE) . |
| 2 552 270 | 3/1985 | (FR) . |
| WO 95/26073 | 9/1995 | (WO) . |
| WO 97/09637 | 3/1997 | (WO) . |
| WO 97/09777 | 3/1997 | (WO) . |

OTHER PUBLICATIONS

Muller et al., "A GaAs HEMT MMIC Chip Set for Automotive Radar Systems . . ." 18$^{th}$ Annual GaAs IC Symposium, Technical Digest, Nov. 1996, pp. 189–192.*
Geddes et al., "A Millimeter Wave Passive FET Mixer with Low I/F Noise", Microwave Symposium Digest., IEEE MTT–S International, vol. 3, 1991, pp. 1045–1047.*
M. Nalezinski, et al., "Novel 24 Ghz FMCW Front–End with 2.45 GHz Saw Reference Path for High–Precision Distance Measurements", 1997 IEEE MTT–S, International Microwave Symposium Digest, Denver, Jun. 8–13, 1997, vol. 1, pp. 185–188.
V. Rizzoli, et al., "General–Purpose Noise Analysis of Forced Nonlinear Microwave Circuits", Proc. Of the MM Conference, Brighton, Oct. 14, 1992, pp. 293–298.
A. Minakawa, et al., "A Millimeter–Wave Band MMIC Dual–Quadrature Up–Converter Using Multilayer Directional Couplers", IEEE Transactions on Microwave Theory and Techniques, vol. 45, No. 1, Jan. 1997, pp. 78–82.
D. Kruger, "Monolithic Dual–Quadrature Mixer Using GaAs FETs", Microwave Journal, vol. 33, No. 9, Sep. 1990, pp. 201, 202, 204–206.
P. Lowbridge, et al., "A Low Cost mm–Wave Cruise Control System for Automotive Applications", Microwave Journal, Oct. 1993, pp. 24–36.

(List continued on next page.)

Primary Examiner—Ian J. Lobo
(74) Attorney, Agent, or Firm—Schiff Hardin & Waite

(57) ABSTRACT

An FMCW sensor in which a transmission signal is generated from a high frequency of a fixed frequency oscillator and a modulated, low frequency of a second oscillator. The modulated frequency is processed in a delay line with a surface wave component to form a reference signal. A transmission mixer with a hybrid coupler having a 90° phase difference and terminated by diodes is employed in a transmission/reception means. A measured signal from the transmission mixer together with the reference signal is interpreted in an evaluation means.

11 Claims, 5 Drawing Sheets

OTHER PUBLICATIONS

B. Zimmerman, et al., "24 Ghz Microwave Close–Range Sensors for Industrial Measurement Applications", Microwave Journal, May 1996, pp. 228–238.

K. Lange, et al., "Taschenbuch der Hochfr4equenztechnik", $5^{th}$ Ed., Springer–Verlag, 1986 pp. 04–06.

* cited by examiner

FMCW SENSOR

BACKGROUND OF THE INVENTION

The present invention is directed to an FMCW sensor.

Given sensor systems with FMCW radar, particularly microwave radar systems, it is possible to obtain simultaneous range and velocity measurements. Such sensor systems have versatile use possibilities, for example in the automotive or automation technologies. The abbreviation FM stands for frequency modulation and CW stands for continuous wave. A signal source generates a frequency-modulated signal that propagates wave-like. The signal source comprises, for example, a microwave oscillator and a modulator. The preferably linearly frequency-modulated signal is beamed out by an antenna and is reflected from a target. The received signal is mixed in a mixer with the transmission signal present at the moment. The difference frequency that derives is a measure for the distance of the target from the antenna. A monostatic or a bistatic antenna arrangement can be employed for the transmission and reception means. Given the monostatic arrangement, the transmission and the reception signals are beamed out or, received by the shared transmission and reception antenna. As a result of a circulator or directional coupler, the transmission and the reception signals are separated from one another, i.e. the transmission signal is separated by the reception mixer and the reception signal is separated from the transmission path. Given the bistatic antenna arrangement, separate transmission and reception antennas are provided.

PCT Patent Application No. 97/09637 discloses an FMCW radar sensor wherein a delay line is present as a reference means. A time-delayed signal is generated from the transmission signal with this reference means, a balancing and a correction of a measured signal being capable of being undertaken with said time-delayed signal such that a non-linear curve of the characteristic of the modulation can thus be computer-compensated. A correction of the modulation characteristic on the basis of an evaluation of the reference signal is likewise possible. PCT Patent Application No. 97/09777 discloses a device serving a similar purpose.

Further examples for linearization of the modulation given FMCW sensors may be found in the publications by B. Zimmermann et al., "24 GHz Microwave Close-Range Sensors For Industrial Measurement Applications" in Microwave Journal, May 1996, pages 228 through 238, and by P. Lowbridge et al., "A Low Cost mm-Wave Cruise Control System for Automotive Applications" in Microwave Journal, October 1993, pages 24 through 36. A closed control loop, for example with digital frequency discriminator, is employed, this being supplied with an intermediate frequency signal. An additional, frequency-stable local oscillator is required for this purpose. As an alternative thereto, U.S. Pat. No. 5,546,088 discloses a radar sensor wherein a frequency-modulated 24 GHz radar signal is generated by five-fold frequency multiplication of a 4.8 GHz VCO signal. However, a considerable circuit outlay is required for this purpose.

What is also disadvantageous about known FMCW sensors is that separate transmission and reception devices must be present given the bistatic structure and a circulator or hybrid coupler or, directional coupler for dividing transmission and reception signals onto the various signal paths is required given the monostatic structure. German Patent Application No. 196 10 850 discloses a monostatic, homodyne radar system, whereby a balanced mixer (push-pull mixer) is utilized instead of a traditional directional coupler with separate mixer. The mixer contains a hybrid coupler functioning as directional coupler with 90° phase difference between coupling arms, and comprises a reflection factor of more than 0.3, so that a coupling of the power supplied by the oscillator to the antenna ensues that is adequate for the emission of the transmission signal.

PCT Patent Application No. 95/26073 discloses a radio-frequency oscillator in planar structure, whereby a dielectric resonator is operated in higher modes and is coupled by suitable alignment to a micro strip conductor. Such an oscillator in the region around 24 GHz is suitable as a signal source for FMCW sensors.

SUMMARY OF THE INVENTION

An object of the present invention is to an FMCW sensor, particularly for range measurement, that supplies precise measured results given reduced manufacturing outlay.

This object is achieved in accordance with the invention in an FMCW sensor having a fixed frequency generator for generating a carrier frequency and having an output; a second frequency generator for generating variable modulation frequencies and having an output; a mixer for generating mixed signals from the carrier frequency and the modulation frequencies and for reducing the generated mixed signals to a predetermined frequency band, the mixer including a field effect transistor having a gate terminal connected to the output of the fixed frequency generator, a source terminal connected to ground, and a drain terminal connected to the output of the second frequency generator, and including an output, the mixed signals being supplied from the drain terminal to the output; a transmitter and receiver unit having an input connected to the output of the mixer and having an output; a reference unit having an input connected to the output of the second frequency generator and having an output; and an evaluation means having an input connected to the output of the transmitter and receiver unit, an input connected to the output of the reference unit, and an output.

The inventive sensor has components that guarantee an exact measurement but that are fashioned such that the outlay remains slight in the manufacture of the sensor. The means utilized for this purpose are not all necessary. A preferred exemplary embodiment, however, derives from a combination of all improvements recited below. The inventive sensor is especially suited for the realization as a hybrid planar circuit (for example, in micro strip line technology or coplanar technology).

The sensor employs a reference means that comprises a delay line. The non-linearity of the modulation characteristic can thus be computer-corrected or can be corrected by a corresponding pre-distortion of the modulator. The reference signal is acquired in that a modulated, comparatively low-frequency signal is time-delayed and is mixed with the undelayed signal. The modulated, low-frequency signal is inventively supplied by a frequency generator (oscillator) suitable for this purpose. Since a radio-frequency, modulated signal is required as transmission signal, the low-frequency, modulated signal is converted into a radio-frequency, modulated signal by mixing with a fixed radio-frequency signal. Only a frequency generator that supplies a signal with a high fixed frequency but no radio-frequency modulatable oscillator is therefore inventively required. In particular, an oscillator that is constructed with a dielectric resonator according to the aforementioned PCT Patent Application No. 95/26073 is suitable as a fixed frequency generator for high frequency. The technical demands in view of temperature stability, output power, center frequency reproducibility and phase noise can be met with dielectrically stabilized fixed-frequency oscillators.

A further simplification of the technical outlay given the inventive sensor can be achieved in that a monostatic transmission and reception system is employed, this achieving a separation of transmission and reception signals not with a traditional circulator or directional coupler but by employing a specific mixer operated in transmission, so that a separate separation of transmission and reception signals can be foregone.

The components having non-linear characteristic of the mixers employed in the sensor can be manufactured comparatively inexpensively by employing suitable, commercially obtainable field effect transistors instead of diodes.

These and other features of the invention(s) will become clearer with reference to the following detailed description of the presently preferred embodiments and accompanied drawings.

DETAILED DESCRIPTION OF THE PRESENTLY PREFERRED EMBODIMENTS

Figure 1:
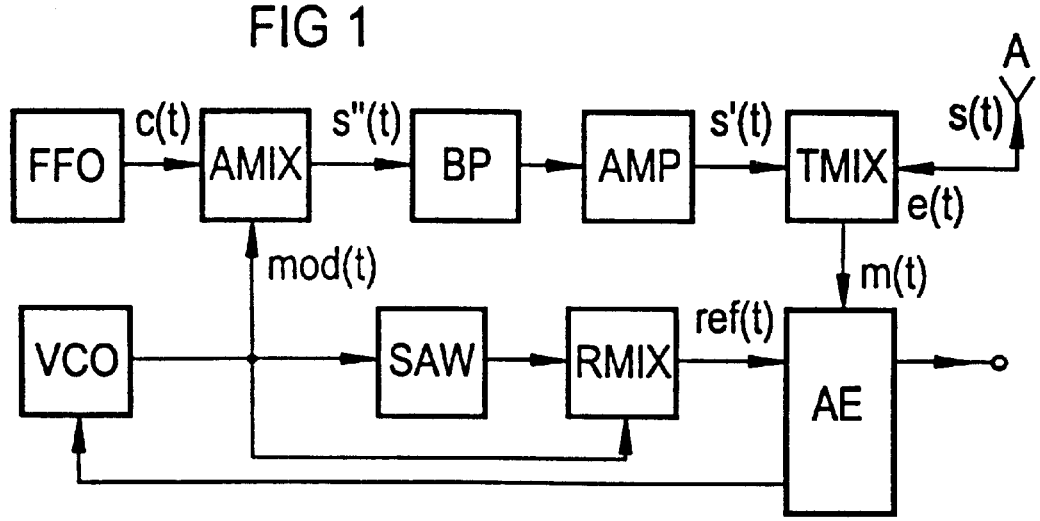
FIG. 1 is a block circuit diagram of an FMCW sensor constructed in accordance with the present invention.

In accordance with the present invention, a sensor that is fundamentally constructed according to the block circuit diagram of FIG. 1 requires only one radio-frequency oscillator, which need not be modulated. To this end, a fixed frequency oscillator FFO ("local oscillator") can be provided, this being connected to a mixer AMIX.

In this mixer, AMIX the high-frequency output signal of the fixed frequency oscillator FFO is mixed with a lower and modulated frequency that a second oscillator, a voltage-controlled oscillator VCO in this example, supplies. The frequency-modulated signal mod(t) modulates the radio frequency carrier signal c(t), adjacent at AMIX, so that AMIX supplies a signal s"(t) that is spectrally composed of the frequency-modulated signal mod(t), of the carrier c(t) and of two resulting side bands. The frequency of the fixed frequency oscillator FFO is, for example, 21.7 GHz. The second oscillator VCO generates a frequency-modulated signal with a center frequency of, for example, 2.4 GHz. Given the selection of 2.4 GHz as center frequency of the frequency-modulated signal, the surface wave delay line of the reference means can still be employed, even though the technology of surface wave components is encountering its technical limits given increasing frequencies. The spacing of the side bands is likewise adequately great in order to be able to effectively suppress the carrier frequency in the transmission spectrum. The mixed signal at the output of the mixer AMIX, in addition to having the carrier frequency, also has a lower and an upper side band at the spacing of 2.4 GHz.

Figure 2:
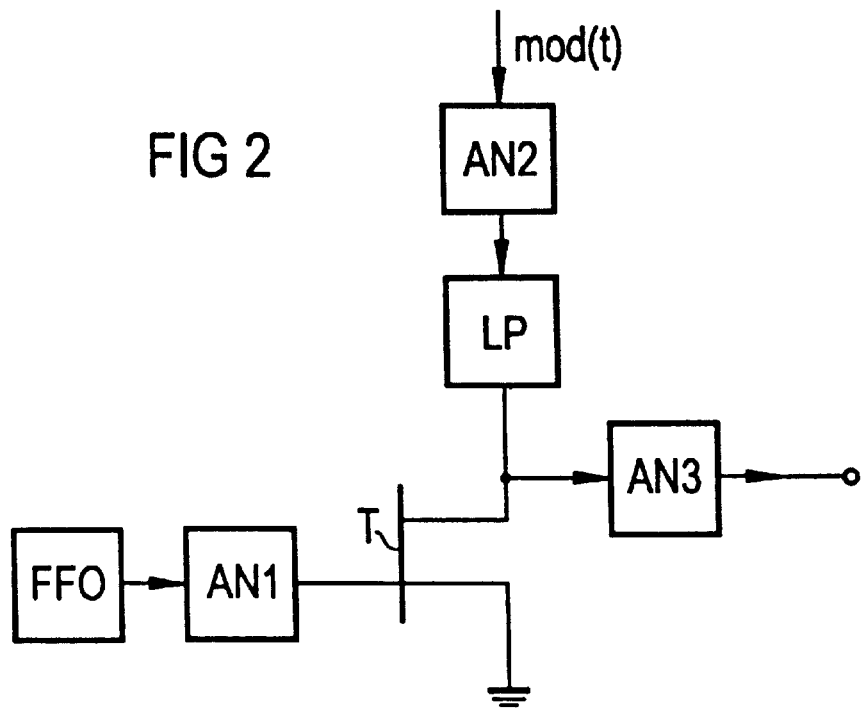
FIG. 2 is an embodiment of a mixer constructed in accordance with the present invention.

The mixer AMIX can be constructed with a field effect transistor. A pertaining exemplary embodiment of the mixer is shown in the block circuit diagram in FIG. 2. In FIG. 2, the upper left part of the block circuit diagram of FIG. 1 is shown for the employment of a field effect transistor as mixer AMIX. The fixed frequency oscillator FFO is conducted via a matching network AN1 to the gate terminal of a field effect transistor T. An HEMT (high electron mobility transistor) is preferably employed therefor. The modulated signal mod(t) from the second oscillator VCO is preferably conducted via a further matching network AN2 and a low-pass filter LP to the drain terminal of the transistor t. The source terminal lies at ground.

Preferably again via a matching network AN3, the multiplied signal can be taken at the drain terminal and supplied to the further components (frequency filter BP).

Figure 3:
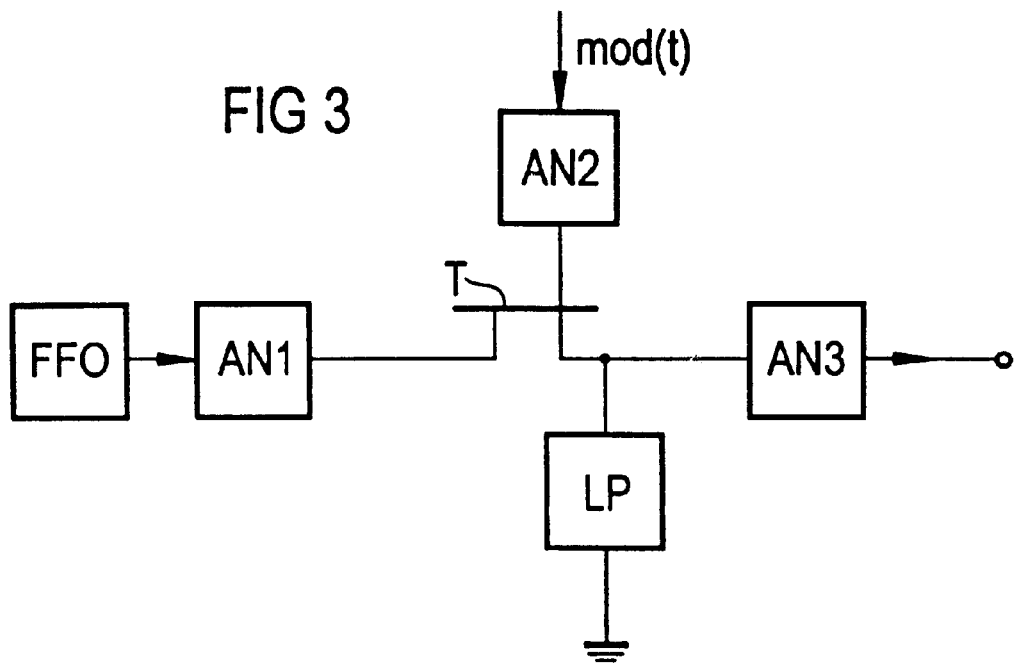
FIG. 3 is an embodiment of a mixer constructed in accordance with the present invention.

FIG. 3 shows an alternative to the circuit of FIG. 2. The frequency-modulated signal mod(t) is conducted here via a matching network AN2 to the gate of the transistor t, whereas the carrier signal c(t) coming from the fixed frequency oscillator FFO is mixed to form the signal s"(t) in the output via the first matching network AN1, drain, source and the matching network AN3. A low-pass filter LP in the output shorts the low-frequency parts to ground.

Figure 4:
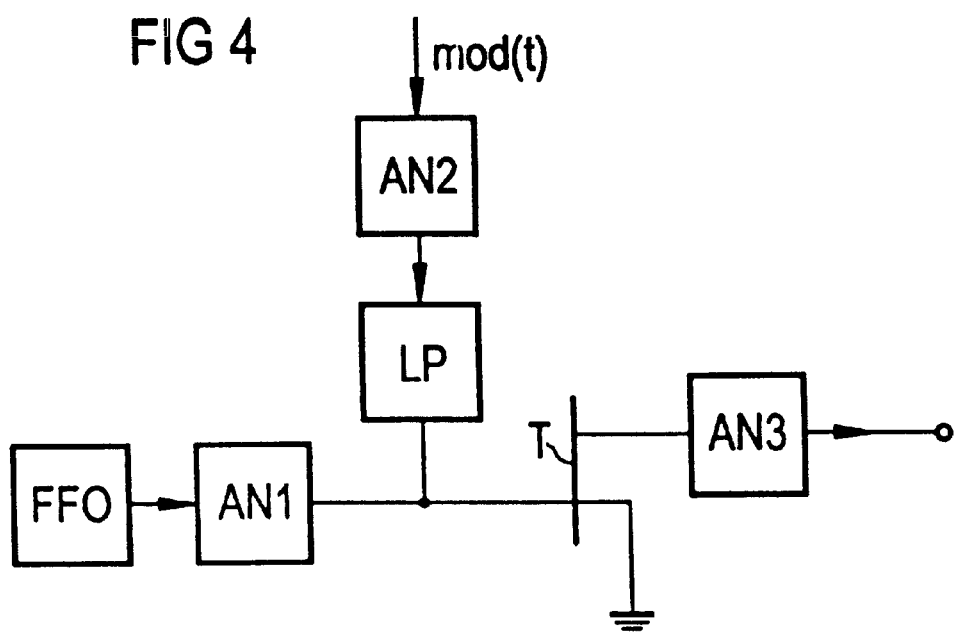
FIG. 4 is an embodiment of a mixer constructed in accordance with the present invention.

FIG. 4 likewise shows an alternative to the circuit of FIG. 2. The carrier signal c(t) coming from the fixed frequency oscillator FFO proceeds via the first matching network AN1 and the frequency-modulated signal mod(t) proceeds via the second matching network AN2 and a low pass filter LP, respectively proceeding to the gate of the transistor T. Source lies at ground, and the signal s"(t) is taken from the drain of the transistor T via a third matching network AN3.

Figure 5:
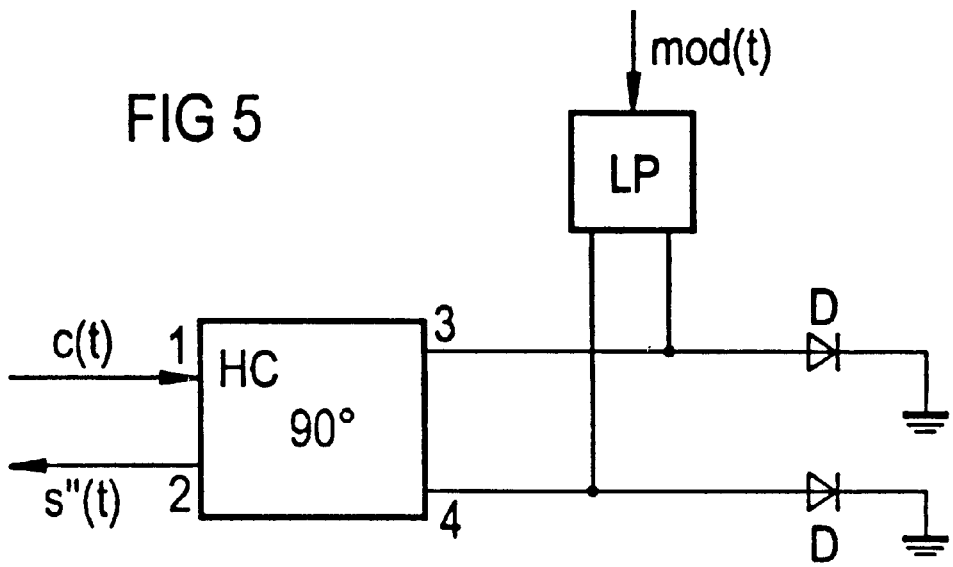
FIG. 5 is an embodiment of a mixer constructed in accordance with the present invention.

FIG. 5 shows another embodiment of the mixer AMIX wherein a hybrid coupler HC having 90° phase shift is employed between the coupling arms. The carrier signal c(t) coming from the fixed frequency oscillator FFO is adjacent at an input 1 of the hybrid coupler; HC the modulated signal mod(t) from the second oscillator VCO is conducted via a low pass filter LP to the outputs 3, 4 of the hybrid coupler, HC which are terminated to ground via diodes D. The diodes D are switched between conductive and blocking condition by the modulated signal mod(t). As a result thereof, a phase-modulated signal arises that can be taken as signal s"(t) at the second input 2 of the hybrid coupler HC (output of AMIX in this version).

Figure 6:
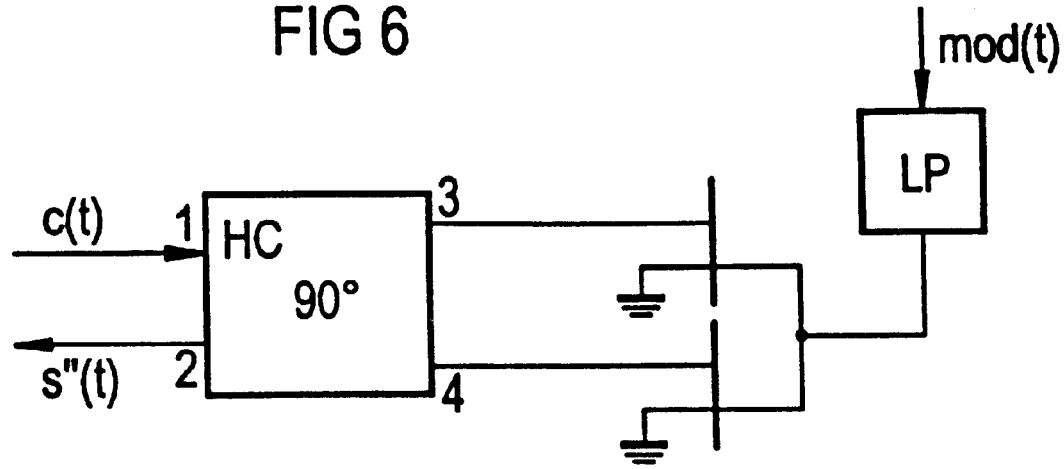
FIG. 6 is an embodiment of a mixer constructed in accordance with the present invention.

FIG. 6 shows the arrangement of FIG. 5 wherein the diodes D are replaced by field effect transistors. The drain terminals of the transistors are connected to the outputs 3, 4 of the hybrid coupler. HC The source terminals lie at ground. The modulated signal mod(t) coming from the second oscillator VCO is applied via a low pass filter LP to the gate terminals.

Referring to FIG. 1, frequency filter BP following the mixer AMIX filters the upper side band at 24.1 GHz out, i.e.

this side band is allowed to pass. The carrier signal c(t) of 21.7 GHz and the lower side band of 19.3 GHz are suppressed. Alternatively, the lower side band can be filtered out. When a carrier frequency of 26.5 GHz is selected, the lower side band likewise lies at the provided frequency of 24.1 GHz. Due to the specific embodiment of the band pass filter, the necessary suppression of the carrier frequency and existing, undesired secondary frequencies can be achieved. A preferred embodiment of the filter comprises an especially thin substrate having, for example, a thickness of approximately 127 μm and comprises a RF absorbent material at a slight distance from a filter structure fashioned as a strip line. The RF-absorbent material is applied at one side or both sides parallel next to the filter structure, potentially above it as well.

Figure 7:
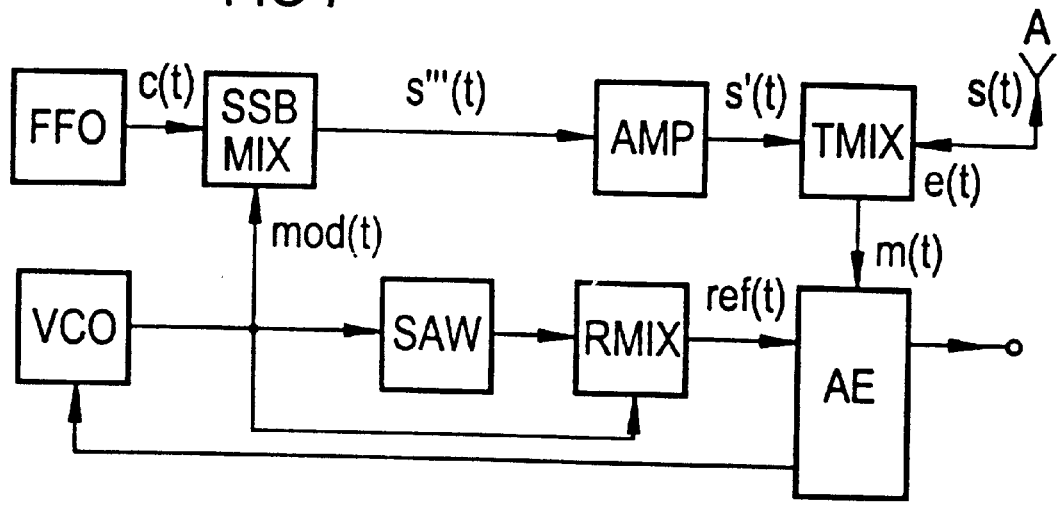
FIG. 7 is a block circuit diagram of an alternate embodiment of an FMCW sensor constructed in accordance with the present invention.
Figure 8:
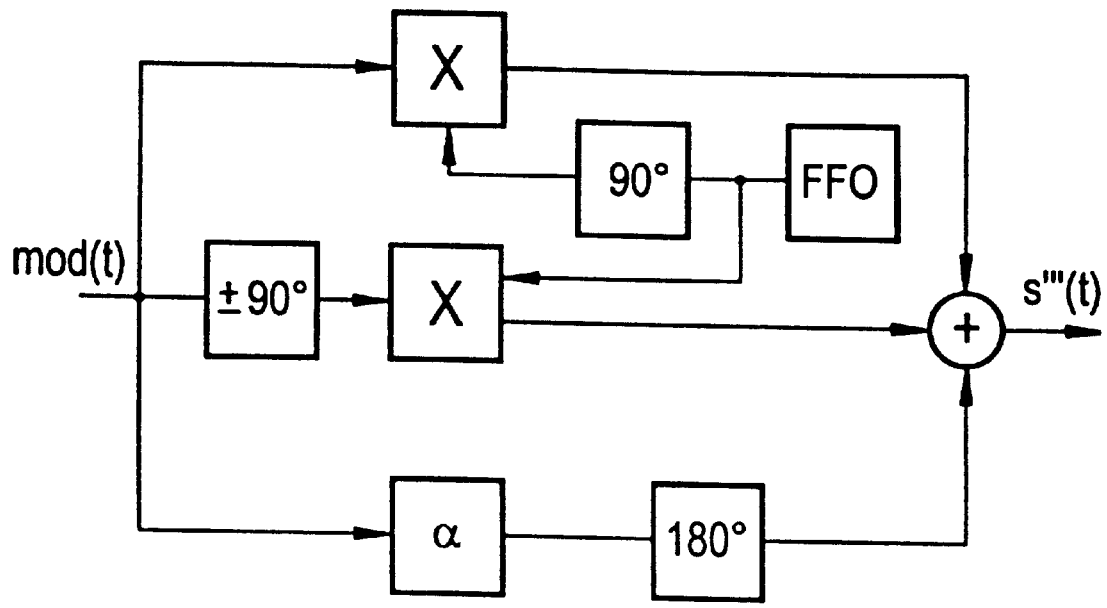
FIG. 8 is a block circuit diagram of a mixer working according to the phase method.

Instead of the previously described embodiment of the filter AMIX, the upper side band of the mixed frequencies can also be generated according to the known method referred to as phase method (see, for example, Meinke/Gundlach, Taschenbuch der Hochfrequenztechnik, 5th Edition, Springer-Verlag, Berlin/Heidelberg, 1992, pages O 4 through O 6). In the phase method, a number of sub-signals are generated in the mixing, and a quenching of the lower side band and of the carrier signal c(t) as well as a constructive superposition of the upper side band are produced by superposition of the sub-signals with suitable phase shifts relative to one another. A mixer SSBMIX suitable for this purpose replaces the mixer AMIX and the band pass filter BP according to the illustration in FIG. 7. The mixer SSBMIX can, for example, have the standard arrangement of a single-side band mixer shown as a block circuit diagram in FIG. 8.

An amplifier AMP (see FIG. 1 or, FIG. 7) is advantageously present, the 24.1 GHz signal being amplified therein. The specific embodiments of the mixer AMIX or, SSBMIX reduce the conversion losses, so that a subsequent amplification of the signals "(t) or s'"(t) can either be entirely foregone or, on the other hand, only a single-stage amplifier need be employed in order to achieve the optimum operating point of the transmission and reception mixer TMIX. As a result thereof, the practical realization of the overall system is significantly simplified. Finally, the signal s'(t) is supplied to the transmission/reception means. The band pass filter BP in other embodiments can be arranged directly preceding the antenna A or between the amplifier AMP and the transmission/reception means.

The modulated, low-frequency signal mod(t) of 2.4 GHz supplied by the second oscillator VCO is also supplied to the input of a reference means in this example. This reference means has a delay line with which the supplied signal is time-delayed. For example, a surface wave component SAW is particularly suited for this purpose. The time-delayed signal is mixed in a further mixer RMIX with the original signal of the second oscillator to form a reference signal ref(t).

The transmission/reception means is fashioned as a monostatic system. A transmission/reception mixer TMIX is present to which the transmission signal s'(t) (potentially amplified by the amplifier AMP) is supplied. This transmission/reception mixture conducts the transmission signal s(t) to the antenna A. The received signal e(t) in turn proceeds into the transmission/reception mixer TMIX and is demodulated therein with the transmission signal s(t) and is supplied to an evaluation means AE as measured signal m(t).

The reference signal ref(t) likewise proceeds into this evaluation means AE. A possible embodiment provides the acquisition of a suitable correction for the modulation of the second oscillator VCO via a comparison of the measured signal m(t) to the reference signal ref(t).

The evaluation of the sensor signals occurs within the evaluation means AE. This unit also has the job of correcting the phase errors of the modulation that occur in practice. This can subsequently ensue by computer on the basis of a correction of the measured signal m(t). Alternatively— potentially also additionally—, a pre-distortion of the modulation characteristic is provided in the second oscillator VCO. The modulation of this second oscillator VCO is then distorted to the effect that a modulated signal mod(t) with linear frequency change is generated at the output of the oscillator. VCO Phase errors that are respectively still present are acquired by employing the reference means, and a corresponding correction of the measured signal m(t) and/or of the modulation is derived therefrom. Devices suitable for this purpose are disclosed, for example, in the initially cited German Patent Application No. 196 10 850 and in WO 97/09777.

Figure 9:
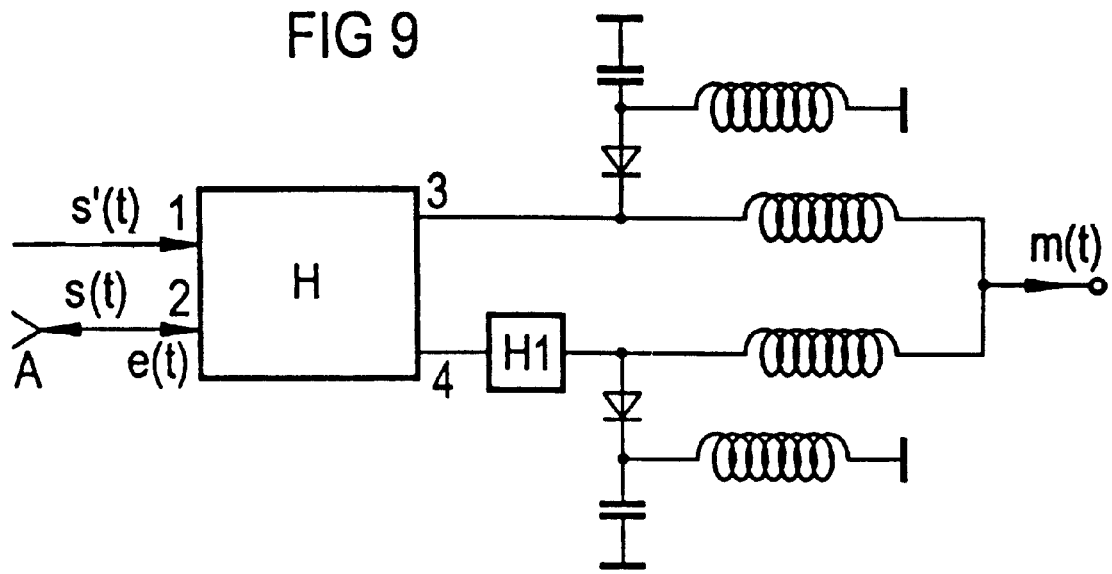
FIG. 9 is a block circuit diagram of an embodiment of the transmission/reception mixer.

FIG. 9 shows an embodiment of a balanced mixer utilized in the transmission/reception means. This is a transmission mixer that comprises a hybrid coupler H and diodes or other non-linear components, and that allows a part of the signal supplied at an input to pass the hybrid coupler H to the other input. The phase difference between the two coupling aims of the hybrid coupler H amounts to 90°. The mixer is designed such that the coupling arms are terminated by identical load impedances with a reflection factor lying so clearly above 0 that an adequate part of the power offered by the oscillator is coupled over onto the other input port of the mixer and is available for the emission. The intermediate frequency generated by the mixing of the signal s'(t) and a reception signal e(t) (FIG. 1 or, FIG. 7) can be taken at an output port of the mixer as measured signal m(t).

FIG. 9 shows a hybrid coupler H having four connecting ports. The incoming signal s'(t) is adjacent at an input port 1. The other input port 2 is connected to the antenna A, so that the transmission signal s(t) leaves the hybrid coupler H thereat and the reception signal e(t) proceeds into the hybrid coupler H thereat. Compared to balance mixers of a standard type, no optimally good decoupling of all ports is aimed at in this mixer. Given the arrangement of FIG. 1, namely, this would result therein that no emission ensues via the antenna A because the entire power proceeding from the oscillator to the input port 1 of the mixer would be absorbed in the mixer. The transmission mixer employed here is therefore of such a nature that a defined part of the power of the radio frequency signal supplied by the oscillator couples over to the other input port 2 of the mixer and proceeds to the antenna in this way. No further components or assemblies are therefore required in order to realize the transmission/reception mixer TMIX.

The diodes entered in FIG. 9 are arranged oppositely relative to one another as an example. Instead, the diodes can be arranged in the same sense relative to one another or, for example, can also be respectively circuited in series between an output port 3, 4 of the hybrid coupler H and the output of the transmission mixer, TMIX which is conducted to the evaluation means AE, as indicated in the above-cited German Patent Application No. 196 10 850. Linear combinations of the signals adjacent at the inputs 1, 2 of the hybrid coupler H proceed to the outputs 3, 4 of the hybrid coupler H. Due to the non-linear characteristics, the diodes generate signals at, among other things, the difference frequency that proceeds as measured signal m(t) to the output via the further circuit components entered as examples that, however, can be modified in conformity with the respective exemplary embodiments. From there, the measured signal m(t) is conducted to the evaluation means AE. The desired reflection factor derives either directly due to the impedance of the existing diodes or suitable means are utilized such as, for example, transformation networks in the hybrid coupler H or a DC voltage suitably applied to the diodes. It is also possible to employ a hybrid coupler H with a phase difference of 180° between the coupling arms when a circuit element H1 that shifts the phase by 90° is additionally installed at an output port 4 of the hybrid coupler H. This circuit element H1 entered in FIG. 9 can be eliminated when the hybrid coupler H already exhibits the desired phase difference of 90°. Fundamentally, an arbitrary quadrupole can be employed as transmission/reception mixer TMIX, whereby one port is insulated from the input ports and the power supplied at the input port is symmetrically divided onto the remaining two ports.

Figure 10:
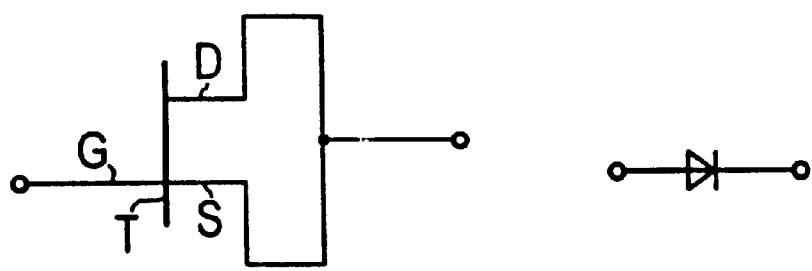
FIG. 10 is a block circuit diagram of a field effect transistor given shorted source and drain terminals and an equivalent circuit diagram of this transistor as a diode.

Instead of the diodes, other semiconductor components that comprise non-linear characteristics can be employed in the arrangement. For example, a field effect transistor, preferably an HEMT, whereby the source terminal S and the drain terminal D are shorted as entered in FIG. 10, can be employed. The path from the gate terminal to the shared terminal of source and drain then forms an equivalent circuit diagram corresponding to a diode that is entered at the right in FIG. 10. The polarization of the diode is fundamentally dependent on the selected type of transistor but corresponds to the polarization shown in FIG. 10 given a PHEMT.

Although modifications and changes may be suggested by those of ordinary skill in the art, it is the intention of the inventors to embody within the patent warranted hereon all changes and modifications as reasonably and properly come within the scope of their contribution to the art.

What is claimed is:

1. An FMCW sensor comprising:
    a fixed frequency generator for generating a carrier frequency and having an output;
    a second frequency generator for generating variable modulation frequencies and having an output;
    a mixer for generating mixed signals from said carrier frequency and said modulation frequencies and for reducing said generated mixed signals to a predetermined frequency band, said mixer including a field effect transistor having a gate terminal connected to said output of said fixed frequency generator, a source terminal connected to ground, and a drain terminal connected to said output of said second frequency generator, and including an output, said mixed signals being supplied from said drain terminal to said output;
    a transmitter and receiver unit having an input connected to said output of said mixer and having an output;
    a reference unit having an input connected to said output of said second frequency generator and having an output; and
    an evaluation means having an input connected to said output of said transmitter and receiver unit, an input connected to said output of said reference unit, and an output.

2. The FMCW sensor according to claim 1, wherein said field effect transistor is an HEMT (high electron mobility transistor).

3. The FMCW sensor according to claim 1,
    wherein said transmitter and receiver unit is for monostatic operation and further comprises:
        a transmission mixer including a first input connected to said mixer, a second input, an output, and a hybrid coupler having a first output attached to a first coupling arm and a second output attached to a second coupling arm, said first and second coupling arms having a phase difference of 90°; and
        an antenna connected to said second input of said transmission mixer;
        at least one non-linear component terminating at least one of said first and second outputs of said hybrid coupler; and
    wherein said evaluation means is connected to said output of said transmission mixer.

4. The FMCW sensor according to claim 3, wherein said at least one non-linear terminating component is a field effect transistor having a source terminal and a drain terminal connected to each other.

5. The FMCW sensor according to claim 3, wherein said hybrid coupler comprises a first output attached to a first coupling arm, a second output attached to a second coupling arm, said first and second coupling arms having a phase difference of 180°, and a circuit element for effecting a phase shift of 90° arranged in one of said first and second coupling arms.

6. The FMCW sensor according to claim 3, wherein said first input of said transmission mixer is connected to said mixer via at least one further circuit element.

7. The FMCW sensor according to claim 1, wherein said reference unit is a delay line for generating a reference signal that is time-delayed compared to said transmission signal.

8. The FMCW sensor according to claim 7, wherein said reference unit comprises a surface wave component and a second mixer.

9. The FMCW sensor according to claim 1, further comprising a following frequency filter is connected between said mixer and said transmitter and receiver unit for reducing said generated mixed signals to a predetermined frequency band.

10. An FMCW sensor comprising:
    a fixed frequency generator for generating a carrier frequency and having an output;
    a second frequency generator for generating variable modulation frequencies and having an output;
    a mixer for generating mixed signals from said carrier frequency and said modulation frequencies and for reducing said generated mixed signals to a predetermined frequency band, said mixer including a field effect transistor having a gate terminal connected to said output of said second frequency generator, a source terminal connected to ground via a low pass filter, and a drain terminal connected to said output of said fixed frequency generator, and including an output, said mixed signals being supplied from said source terminal to said output;
    a transmitter and receiver unit having an input connected to said output of said mixer and having an output;
    a reference unit having an input connected to said output of said second frequency generator and having an output;
    an evaluator having an input connected to said output of said transmitter and receiver unit, an input connected to said output of said reference unit, and an output.

11. The FMCW sensor according to claim 10, further comprising a following frequency filter connected between said mixer and said transmitter and receiver unit for reducing said generated mixed signals to a predetermined frequency band.

* * * * *